US008793115B2

(12) United States Patent
Vanspauwen et al.

(10) Patent No.: US 8,793,115 B2
(45) Date of Patent: Jul. 29, 2014

(54) INTERFACE CONVERTER FOR UNIFIED VIEW OF MULTIPLE COMPUTER SYSTEM SIMULATIONS

(75) Inventors: Niels Vanspauwen, Heverlee (BE); Tom Michiels, Leuven (BE); Karl Van Rompaey, Nieuwpoort (BE)

(73) Assignee: Synopsys, Inc., Mountain View, CA (US)

( * ) Notice: Subject to any disclaimer, the term of this patent is extended or adjusted under 35 U.S.C. 154(b) by 0 days.

(21) Appl. No.: 12/777,526

(22) Filed: May 11, 2010

(65) Prior Publication Data

US 2011/0119043 A1  May 19, 2011

Related U.S. Application Data

(63) Continuation of application No. 11/066,841, filed on Feb. 25, 2005, now Pat. No. 7,716,031.

(51) Int. Cl.
  *G06F 17/50* (2006.01)
  *G06F 7/60* (2006.01)
  *G06F 13/10* (2006.01)
  *G06F 11/26* (2006.01)

(52) U.S. Cl.
  CPC ............ *G06F 13/105* (2013.01); *G06F 11/261* (2013.01); *G06F 17/50* (2013.01)
  USPC .......................................................... 703/13

(58) Field of Classification Search
  USPC .......................................................... 703/13
  See application file for complete search history.

(56) References Cited

U.S. PATENT DOCUMENTS

| 4,051,352 | A |   | 9/1977  | Eichelberger et al. |
|-----------|---|---|---------|---------------------|
| 5,371,746 | A |   | 12/1994 | Yamashita et al.    |
| 5,410,685 | A | * | 4/1995  | Banda et al. ............... 714/38.13 |
| 5,442,772 | A |   | 8/1995  | Childs et al.       |
| 5,452,437 | A | * | 9/1995  | Richey et al. .................. 714/4.5 |
| 5,615,356 | A | * | 3/1997  | King et al. ..................... 703/21 |
| 5,649,164 | A |   | 7/1997  | Childs et al.       |
| 5,650,946 | A | * | 7/1997  | Trimberger ...................... 703/16 |
| 5,771,370 | A |   | 6/1998  | Klein               |
| 5,784,552 | A | * | 7/1998  | Bishop et al. .............. 714/38.12 |

(Continued)

FOREIGN PATENT DOCUMENTS

| KR | 10-0257516 B1 | 6/2000 |
|----|---------------|--------|
| KR | 1998-0032143  | 7/2003 |
| KR | 2003-0058128  | 7/2003 |

OTHER PUBLICATIONS

Olivier, Pieter. "A Framework for Debugging Heterogeneous Applications", Dec. 2000.*

(Continued)

*Primary Examiner* — Shambhavi Patel
(74) *Attorney, Agent, or Firm* — Fenwick & West LLP

(57) ABSTRACT

Providing a unified view of multiple computer system simulations. A simulation process has a simulation thread that executes a plurality of computer system simulations. The simulation process also has a debug support thread that provides a unified view of the simulations. To provide the unified view, the debug support thread has an external interface, an internal interface to each of the simulations, and an interface converter that converts between the external interface and the internal interfaces. Thus, the external interface provides a unified view of the simulations. The external interface allows a single debugging platform to control and observe the simulations.

21 Claims, 12 Drawing Sheets

(56) References Cited

U.S. PATENT DOCUMENTS

| | | | |
|---|---|---|---|
| 5,790,778 A | | 8/1998 | Bush et al. |
| 5,805,867 A | * | 9/1998 | Kodaira ............................ 703/21 |
| 5,819,093 A | | 10/1998 | Davidson et al. |
| 5,852,449 A | | 12/1998 | Esslinger et al. |
| 5,870,607 A | * | 2/1999 | Netzer ............................ 717/127 |
| 5,911,073 A | | 6/1999 | Mattson, Jr. et al. |
| 5,940,605 A | | 8/1999 | Aoki |
| 5,978,584 A | * | 11/1999 | Nishibata et al. .............. 717/134 |
| 6,014,512 A | * | 1/2000 | Mohamed et al. .............. 703/27 |
| 6,083,281 A | | 7/2000 | Diec et al. |
| 6,145,099 A | | 11/2000 | Shindou |
| 6,167,479 A | | 12/2000 | Hartnett et al. |
| 6,173,241 B1 | * | 1/2001 | Trimberger ...................... 703/13 |
| 6,230,114 B1 | | 5/2001 | Hellestrand et al. |
| 6,418,392 B1 | | 7/2002 | Rust et al. |
| 6,425,762 B1 | | 7/2002 | Ernst |
| 6,453,424 B1 | | 9/2002 | Janniello |
| 6,480,818 B1 | * | 11/2002 | Alverson et al. ................ 703/26 |
| 6,516,460 B1 | * | 2/2003 | Merks et al. .................... 717/124 |
| 6,587,995 B1 | | 7/2003 | Duboc et al. |
| 6,601,229 B1 | | 7/2003 | Niederer et al. |
| 6,625,572 B1 | | 9/2003 | Zemlyak et al. |
| 6,718,294 B1 | * | 4/2004 | Bortfeld ............................ 703/20 |
| 6,718,484 B1 | | 4/2004 | Kodera |
| 6,760,903 B1 | | 7/2004 | Morshed et al. |
| 6,826,717 B1 | | 11/2004 | Draper et al. |
| 6,859,892 B2 | | 2/2005 | Bolding et al. |
| 6,882,968 B1 | * | 4/2005 | Linden ............................ 703/26 |
| 6,901,581 B1 | | 5/2005 | Schneider |
| 7,007,268 B2 | | 2/2006 | Emberson |
| 7,080,283 B1 | * | 7/2006 | Songer et al. .................... 714/30 |
| 7,133,820 B2 | * | 11/2006 | Pennello et al. ................ 703/22 |
| 7,185,319 B2 | | 2/2007 | Kaler et al. |
| 7,346,481 B1 | | 3/2008 | Ballagh et al. |
| 7,350,194 B1 | | 3/2008 | Alpern |
| 7,428,727 B2 | | 9/2008 | Alverson et al. |
| 7,464,373 B1 | | 12/2008 | Yunt et al. |
| 7,512,954 B2 | * | 3/2009 | Srivastava et al. ............ 719/318 |
| 7,716,031 B2 | | 5/2010 | Vanspauwen et al. |
| 7,742,905 B2 | | 6/2010 | Vanspauwen et al. |
| 8,131,523 B1 | | 3/2012 | Yunt et al. |
| 8,484,006 B2 | | 7/2013 | Vanspauwen et al. |
| 2002/0133325 A1 | | 9/2002 | Hoare, II et al. |
| 2002/0174415 A1 | * | 11/2002 | Hines ............................ 717/127 |
| 2002/0199173 A1 | | 12/2002 | Bowen |
| 2004/0010778 A1 | | 1/2004 | Kaler et al. |
| 2005/0183066 A1 | | 8/2005 | Jabori |
| 2005/0256694 A1 | | 11/2005 | Taylor |
| 2006/0069953 A1 | | 3/2006 | Lippett et al. |
| 2008/0077780 A1 | * | 3/2008 | Zingher ............................ 712/227 |
| 2008/0177522 A1 | | 7/2008 | Bolding et al. |

OTHER PUBLICATIONS

Coulad et al. "A Time-Coherent Model for the Steering of Parallel Simulations", Euro-Par 2004, LNCS 3149, pp. 90-97, 2004.*
Gu et al. "Falcon: On-line monitoring for steering parallel programs", Concurrency: Pract. Exper., vol. 10(9), 699-736 (1998).*
Bartz et al. "Rendering and Visualization in Parallel Environments", IEEE Visualization 2001 tutorial 3 on "Rendering and Visualization in Parallel Environments".*
Girod et al. "A System for Simulation, Emulation, and Deployment of Heterogeneous Sensor Networks", ACM 2004.*
Coulad et al. "Toward a Distributed Computational Steering Environment based on CORBA", 2003.*
Bagrodia et al. "Parsec: A Parallel Simulation Environment for Complex Systems", IEEE 1998.*
Kohl et al. "CUMULVS: Providing Fault Tolerance, Visualization, and Steering of Parallel Applications", The International Journal of Supercomputer Applications and High Performance Computing, vol. 11, No. 3, 1997.*
Kohl et al. "Efficient and Flexible Fault Tolerance and Migration of Scientific Simulations Using CUMULVS", ACM 1998.*
Parker et al. "Computational Steering Software Systems and Strategies", 1997.*
Ndumu et al. "Visualising and Debugging Distributed Multi-agent Systems", ACM 1999.*
Looney, Douglas. "Interactive Control of a Parallel Simulation from a Remote Graphics Workstation", 1993.*
Magnusson et al. "Simics: A Full System Simulation Platform", IEEE 2002.*
Kohl et al. "CUMULVS User_s Guide Computational Steering and Interactive Visualization in Distributed Applications", 1999.*
Kohl et al. "CUMULVS: Collaborative Infrastructure for Developing Distributed Simulations", 1997.*
Kohl et al. "CUMULVS: Extending a Generic Steering and Visualization Middleware for Application Fault-Tolerance", IEEE 1998.*
Vetter, Jeffrey. "Experiences using Computational Steering on Existing Scientific Applications", 1999.*
Bagrodia, R. et al., "PARSEC: A Parallel Simulation Environment for Complex Systems," IEEE, 1998, pp. 77-85.
Bedichek, Robert, "Talisman: Fast and Accurate Multicomputer Simulation" ACM, SIGMETRICS '95, Ottawa, Ontario, Canada, 1995, pp. 14-24.
Brewer, E.A. et al., "PROTEUS: A High-Performance Parallel-Architecture Simulator," Massachusetts Institute of Technology, 1991, pp. 1-25.
Burger, D.C. et al., "Accuracy vs. Performance in Parallel Simulation of Interconnection Networks" International Symposium on Parallel Processing, IEEE, Apr. 1995, pp. 22-31.
Chassin De Kergommeaux, J. et al., Paje, an Interactive Visualization Tool for Tuning Multi-Threaded Parallel Applications, Parallel Computing, 2000, pp. 1253-1274, vol. 26.
Coulaud, O. et al., "Toward a Distributed Computational Steering Environment based on CORBA," 1999, pp. 1-6.
Cox, D., "RITSim: Distributed SystemC Simulation," Thesis, Rochester Institute of Technology, Aug. 2005, 72 pages.
Cunha, J.C. et al., "A Debugging Engine for a Parallel and Distributed Environment" Proceedings of DAPSYS '96, 1$^{st}$ Autro-Hungarian Workshop on Distributed and Parallel Systems, Oct. 1996, 8 pages.
Das, S., "Adaptive Protocols for Parallel Discrete Event Simulations," Proceedings of the 1996 Winter Simulation Conference, 1996, pp. 186-193.
Dusseau, A.C. et al., "Effective Distributed Scheduling of Parallel Workloads," SIGMETRICS '96, ACM, 1996, pp. 25-36.
Eom, H. et al., "Speed vs. Accuracy in Simulation for I/O-Intensive Applications," IEEE, 2000, 8 pages.
Ferscha, A., "Probabilistic Adaptive Direct Optimism Control in Time Warp", IEEE 1995, pp. 120-129.
Girod, L. et al., "A System for Simulation, Emulation, and Deployment of Heterogeneous Sensor Networks", SenSys '04, ACM, Nov. 3-5, 2004, 13 pages.
Guthery, S.B., "Self-Timing Programs and the Quantum Scheduler," Communications of the ACM, Jun. 1998, pp. 695-703, vol. 31, No. 6.
Hamnes, D.O. et al., "Investigations in Adaptive Distributed Simulation," 1997, pp. 20-23.
Herrod, S.A., "Using Complete Machine Simulation to Understand Computer System Behavior" Thesis, Stanford University, Feb. 1998, 135 pages.
Ibbett, R.N. et al., "HASE: A Flexible Toolset for Computer Architects," The Computer Journal, 1995, pp. 755-764, vol. 38, No. 10.
International Search Report and Written Opinion, PCT Application No. PCT/US2006/006541, Jul. 21, 2006, 9 pages.
International Search Report and Written Opinion, PCT Application No. PCT/US2006/006298, Jul. 18, 2006, 6 pages.
Jones, K. et al., "Combining Optimism Limiting Schemes in Time Warp Based Parallel Simultations," Proceedings of the 1998 Winter Simulation Conference, 1998, pp. 499-505.
Kvasnica, D.F. et al., "Developing Architecture Adaptive Algorithms using Simulation with MISS-PVM for Performance Prediction," ICS 97, ACM, 1997, pp. 333-339.
Legedza, U. et al., "Reducing Synchronization Overhead in Parallel Simulation", IEEE 1996, pp. 86-95.
Looney, D., "Interactive Control of a Parallel Simulation from a Remote Graphics Workstation" Thesis, Air Force Institute of Technology Air University, Dec. 14, 1993, 82 pages.

(56) References Cited

OTHER PUBLICATIONS

Magnusson, P.S. et al., "Simics: A Full System Simulation Platform", IEEE, 2002, pp. 50-58.

Mukherjee, S.S. et al., "Wisconsin Wind Tunnel II: A Fast and Portable Architecture Simulator," Workshop on Performance Analysis and Its Impact on Design (PAID), Jun. 1997, pp. 1-10.

Perumalla, K.S. et al., "Interactive Parallel Simulations with the JANE Framework," 1999, 7 pages.

Prakash, S. et al., "Asynchronous Parallel Simulation of Parallel Programs," 2007, pp. 1-26.

Prakash, S. et al., "MPI-SIM: Using Parallel Simulation to Evaluate MPI Programs", Proceedings of 1998 Winter Simulation Conference, IEEE, 1998, pp. 467-474.

Reinhardt, S.K. et al., "The Wisconsin Wind Tunnel Virtual Prototyping of Parallel Computers," Proceedings of the ACM SIGMETRICS Conference, ACM, May 1993, pp. 1-13.

Tay, S.C. et al., "Speculative Parallel Simulation with an Adaptive Throttle Scheme," IEEE, 1997, pp. 116-123.

Thanalapati, T. et al., "An Efficient Adaptive Scheduling Scheme for Distributed Memory Multicomputers", IEEE Transactions on Parallel and Distributed Systems, Jul. 2001, pp. 758-768, vol. 12, No. 7.

United States Non-Final Office Action Dated Jan. 10, 2008; U.S. Appl. No. 11/066,841, 18 pages.

United States Final Office Action Dated Aug. 5, 2008; U.S. Appl. No. 11/066,841, 16 pages.

United States Non-Final Office Action Dated Dec. 2, 2008; U.S. Appl. No. 11/066,841, 19 pages.

United States Notice of Allowance Dated Aug. 21, 2009; U.S. Appl. No. 11/066,841, 14 pages.

Zeigler, B.P. et al., "The DEVS/HLA Distributed Simulation Environment and Its Support for Predictive Filtering," University of Arizona, Sep. 1998, 105 pages.

\* cited by examiner

INTERFACE CONVERTER FOR UNIFIED VIEW OF MULTIPLE COMPUTER SYSTEM SIMULATIONS

CROSS REFERENCE TO RELATE U.S. APPLICATIONS

This continuation application claims the benefit of the co-pending, commonly owned U.S. patent application Ser. No. 11/066,841, entitled "INTERFACE CONVERTER FOR UNIFIED VIEW OF MULTIPLE COMPUTER SYSTEM SIMULATIONS," with filing date Feb. 25, 2005, and hereby incorporated by reference in its entirety.

This Application is related to U.S. patent application Ser. No. 11/066,945 by VanSpauwen, et al., filed on Feb. 25, 2005, entitled "Method For Dynamically Adjusting Speed Versus Accuracy Of Computer Platform Simulation, with, and assigned to the assignee of the present invention.

FIELD OF THE INVENTION

Embodiments of the present invention relate to the field of software tools for debugging computer architectures using simulations, such as processor/software and hardware simulations. Specifically, embodiments of the present invention relate to methods and systems that provide a single debugging platform with a unified view of multiple simulations.

BACKGROUND OF THE INVENTION

Recently, the evolution of embedded systems has shown a strong trend towards application-specific, single-chip solutions. As a result, application-specific instruction set processors (ASIP) are more and more replacing off-the-shelf processors in such systems-on-chip (SaC). One of the key factors for a successful design of application-specific instruction set processors (ASIP) is an efficient architecture exploration phase. The objective of the architecture exploration is to reduce the huge design space in order to find the best-suited architecture for a given application under a number of constraints, such as performance, power consumption, chip size, and flexibility. Although there are a number of analytical approaches, large parts of the design space exploration still have to be carried out by simulating alternative architecture implementations. Therefore, design methodology and simulation performance have a significant impact on the efficiency of the exploration process, and hence, on the quality of the architecture implementation and the design time.

FIG. 1 depicts a conventional simulation environment in which a separate debugger is required to observe and control each simulation. The environment is used to simulate an architecture (or platform) that in this case includes multiple processor cores and hardware, such that the platform may be debugged. The hardware debugger 150 and each processor core debugger (e.g., CPU1 and CPU2 debuggers 170) are separate operating system processes. The hardware debugger 150 executes a simulation kernel 160 comprising a hardware simulation 180 and two processor core simulations (CPU1 and CPU2 simulations 175). The hardware debugger 150 has an application program interface (API) to communicate with the hardware simulation 180. However, in order for the hardware debugger 150 to communicate with the processor core simulations 175, which is needed to perform the overall simulation, the processor core simulations 175 each have a software wrapper 185. However, the software wrapper 185 does not allow the processor core simulations 175 to be debugged via the hardware debugger 150. That is, the software wrappers do not allow control and observation of the actual simulation. Rather, separate processor core debuggers 170 are required to control and observe the processor core simulations 175, such that the processor cores may be debugged. Thus, a separate debugger is required to control and observe each simulation in order to debug the platform.

One implication of this conventional environment is that the various debuggers are not synchronized. For example, if the hardware simulation is halted (e.g., hits a watchpoint) the two processor core simulations are unaware of this event, and are thus not synchronized with the hardware simulation. Furthermore, the lack of synchronization prevents rewinding the simulations together to view a previous (synchronized) state of the simulations. Another drawback of the conventional environment is that because a debugger can only set a breakpoint or watchpoint for an event in a simulation that it controls, breakpoints/watchpoints involving multiple simulations are not possible.

SUMMARY OF THE INVENTION

Therefore, it would be advantageous to provide a method and system that facilitates debugging a computer system platform using multiple simulations for different aspects of the platform. It would be further advantageous if the method and system allows a unified view of the multiple simulations to the platform developer. It would be still further advantageous if the method and system allowed the simulations to be rewound with synchronization of the simulations preserved. It would be still further advantageous for the method and system to allow breakpoints/watchpoints involving events in multiple simulations.

Accordingly, embodiments of the present invention provide methods and systems that provide a unified view of multiple simulations being used to simulate different aspects of a computer system platform. The unified view allows a single debugger to control and observe all simulations. The simulations may include a processor core simulation, a hardware simulation, or the like. Embodiments of the present invention allow the simulations to be rewound with synchronization of the simulations preserved. Embodiments of the present invention allow breakpoints/watchpoints involving events in multiple simulations. Embodiments of the present invention provide these advantages and others not specifically mentioned above but described in the sections to follow.

One embodiment in accordance with the present invention is a computer readable medium having stored thereon instructions for implementing a method of providing a unified view of multiple computer system simulations. The instructions comprise a simulation process having a simulation thread that executes a plurality of computer system simulations. The simulation process also has a debug support thread that provides a unified view of the simulations. To provide the unified view, the debug support thread has an external interface, an internal interface to each of the simulations, and an interface converter that converts between the external interface and the internal interfaces. Thus, the external interface provides a unified view of the simulations. The external interface allows a single debugging platform to control and observe the simulations.

In another embodiment, in addition to the above, the instructions include a debugger process that is operable to communicate with the debug support thread via the external interface. Thus, the single debugger has debug access to control and observe each of the simulations.

Another embodiment in accordance with the present invention is a computer-implemented method of providing a unified view for debugging with multiple simulations, such as processor core and hardware simulations. The method comprises receiving a request from a debugging process for debugging access to one of a plurality of simulations in a simulation process. The debugging access may be for controlling or observing a simulation. The simulations have different debugging interfaces from each other. The request is converted to a format that is compliant with the debugging interface of the simulation specified in the request. The converted request is passed on to the simulation via its debugging interface. Therefore, the converting and passing the request provides the debugging process a unified view of the simulations.

BRIEF DESCRIPTION OF THE DRAWINGS

The accompanying drawings, which are incorporated in and form a part of this specification, illustrate embodiments of the invention and, together with the description, serve to explain the principles of the present invention.

DETAILED DESCRIPTION OF THE INVENTION

Figure 1:
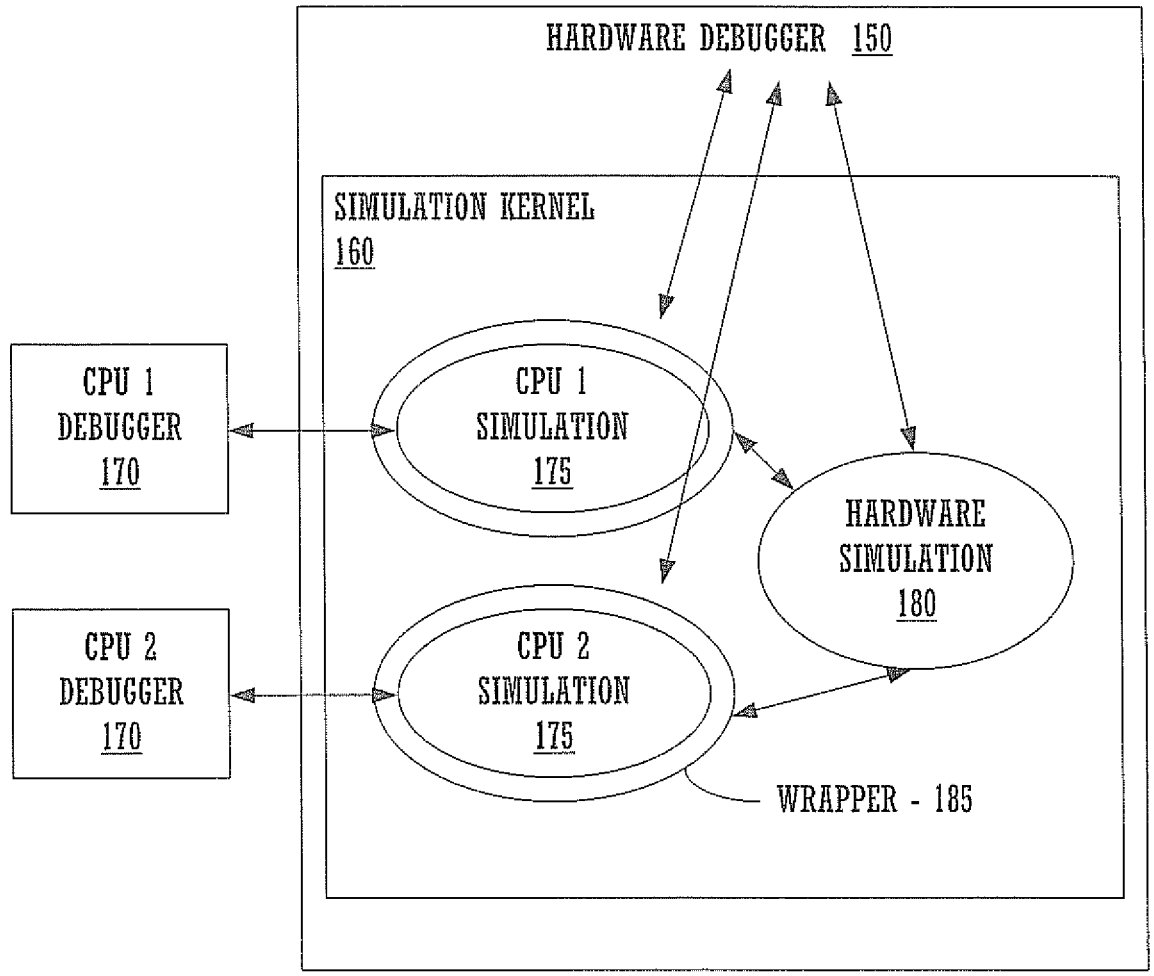
FIG. 1 is a diagram of a conventional debugging environment employing separate debuggers for each simulation.

In the following detailed description of embodiments of the present invention numerous specific details are set forth in order to provide a thorough understanding of the present invention. However, it will be recognized by one skilled in the art that the present invention may be practiced without these specific details or with equivalents thereof. In other instances, well-known methods, procedures, and components have not been described in detail as not to unnecessarily obscure aspects of the present invention.

Notation and Nomenclature

Some portions of the detailed descriptions that follow are presented in terms of procedures, steps, logic blocks, processing, and other symbolic representations of operations on data bits that can be performed on computer memory. These descriptions and representations are the means used by those skilled in the data processing arts to most effectively convey the substance of their work to others skilled in the art. A procedure, computer executed step, logic block, process, etc., is here, and generally, conceived to be a self-consistent sequence of steps or instructions leading to a desired result. The steps are those requiring physical manipulations of physical quantities. Usually, though not necessarily, these quantities take the form of electrical or magnetic signals capable of being stored, transferred, combined, compared, and otherwise manipulated in a computer system. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. Unless specifically stated otherwise as apparent from the following discussions, it is appreciated that throughout the present invention, discussions utilizing terms such as "identifying" or "receiving" or "converting" or "processing" or "passing" or "computing" or "determining" or "maintaining" or "storing" or "constructing" or "accessing" or "selecting" or "forming" or the like, refer to the action and processes of a computer system, or similar electronic computing device, that manipulates and transforms data represented as physical (electronic) quantities within the computer system's registers and memories into other data similarly represented as physical quantities within the computer system memories or registers or other such information storage, transmission or display devices.

Unified View of Simulations

Embodiments of the present invention allow a computer system platform developer to have a unified view of the platform under development. Embodiments of the present invention provide a unified view of various simulations being used to simulate the computer platform. For example, by allowing a unified view of multiple simulations, embodiments of the present invention allow a user to observe and control one or more processor core simulations, a hardware simulation, etc., from a single debugging application. Embodiments of the present invention allow breakpoints and watchpoints to be set using a combination of events in different simulations.

Figure 2:
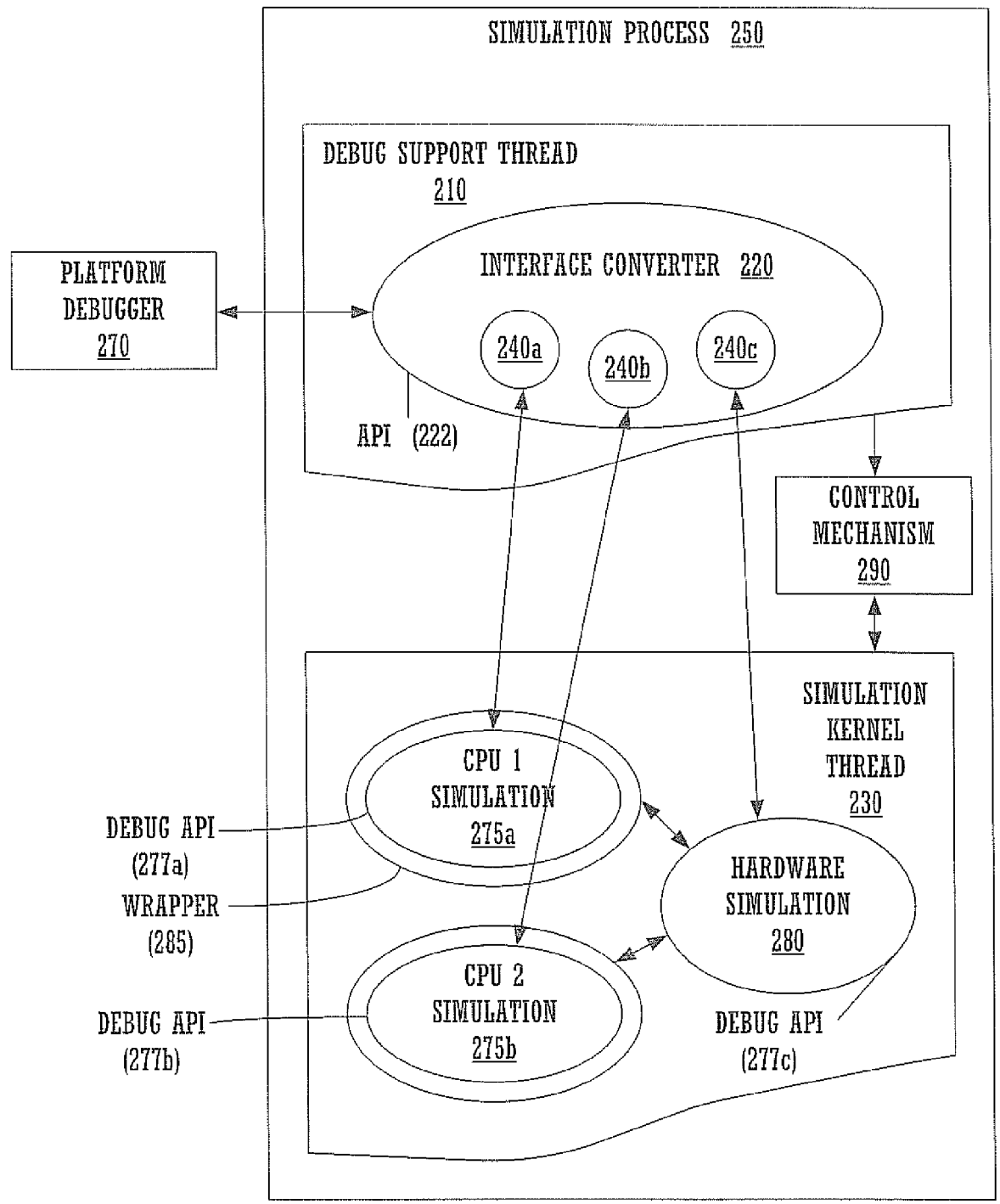
FIG. 2 is a diagram of a system for presenting a unified view of multiple simulations, in accordance with an embodiment of the present invention.

FIG. 2 is a diagram of a system for presenting a unified view of multiple simulations, in accordance with an embodiment of the present invention. One embodiment in accordance with the present invention is a computer readable medium having stored thereon instructions for implementing a method of providing a unified view of multiple computer system simulations. The simulation process 250 comprises a debug support thread 210 and a simulation kernel thread 230. The simulation kernel thread 230 comprises multiple simulations (275a, 275b, 280), each of which simulates one or more aspects or portions of the computer system platform. In this case, the simulations include two processor core simulations 275a, 275b and a separate hardware simulation 280. However, the simulation kernel thread 230 may contain other types of simulations. Further, it is not required that a given simulation be limited to only one portion or aspect of the platform such as hardware, software, or a processor core. Moreover, it is not required that any particular type of simulation be present.

The simulation kernel thread controls the execution of the various simulations. In one embodiment, the simulation kernel thread invokes the various simulations, wherein each simulation is allowed to execute for up to a pre-determined number of clock cycles without stopping to, for example, synchronize with other simulations. The pre-determined number of clock cycles is referred to herein as a quantum. The simulation may halt prior to the end of the quantum of clock cycles. For example, if the simulation encounters a breakpoint or watchpoint it halts prior to completing the quantum of clock cycles.

The quantum is dynamically adjustable and may be based on simulation events. If the quantum is set relatively high, the computer system platform simulation may be faster but possibly less accurate. If the quantum is set lower, the platform simulation may be slower and possibly more accurate. For example, a hardware designer may desire a very accurate simulation, whereas a software developer may desire a faster simulation and be willing to trade some accuracy.

The platform debugger 270 is a tool that allows a user to observe and control the simulations 275a, 275b, 280, wherein the platform being simulated may be debugged. The debug support thread 210 comprises an interface converter 220 that allows the platform debugger 270 to have a unified view of all of the simulations 275a, 275b, 280 in the simulation kernel thread 230. The interface converter 220 presents an external API 222 to the platform debugger 270. Each of the simulations has a debug interface 277a-c that allows observation and control of the actual simulation. The interface converter has API converter blocks 240a-c that each convert from the external API to the respective debug APIs used by each of the simulations.

Thus, the platform debugger 270 has a uniform view to observe and control the simulations 275a, 275b, 280. For example, the platform debugger 270 may use an API call to inspect or to modify a simulation. In one embodiment, to facilitate synchronization of the simulations, API calls that modify a simulation are allowed only when the simulation is halted. The inter-process communication between the platform debugger 270 and the simulation process 250 is implemented with the Common Object Request Broker Architecture (CORBA), in one embodiment. However, inter-process communication is not limited to CORBA. The platform debugger 270 may execute on the same computer system as the simulation process 250. Alternatively, the platform debugger 270 executes on a different computer system than the simulation process 250. If desired, "stand-alone" debuggers (not depicted in FIG. 2) that control and observe only one simulation may be added to the debugging environment.

Some of the simulations may have a software wrapper 285, in order to allow inter-simulation communication. For example, the CPU1 and CPU2 simulations 275a, 275b each have their own software wrapper 285 to allow communication with the hardware simulation 280. However, the platform debugger 270 does not need the software wrappers 285 to control and observe the simulations 275a, 275b, 280.

Still referring to FIG. 2, the simulation process 250 comprises a control mechanism 290 for halting and starting execution of the simulation kernel thread 230. Furthermore, embodiments of the present invention synchronize the various simulations at various points in their execution. In other words, the simulations are halted at a common point in execution. For example, the simulations may execute sequentially and may be aware of a common clock such that each simulation can be halted at the same clock cycle (e.g., a common point in their respective executions). In one embodiment, the control mechanism 290 comprises a semaphore, although the present invention is not so limited.

The debug support thread 210 allows continued viewing of the simulations when they are halted. When a breakpoint or watchpoint condition is detected, the control mechanism 290 is used to halt execution of all simulation processes. For example, if the CPU 1 simulation 275a detects that a breakpoint is hit, it may signal the control mechanism 290, which halts the execution of the entire simulation kernel thread 230.

While the simulation kernel thread 230 is halted the debug support thread 210 continues to run, wherein the platform debugger 270 has continued visibility to the simulations. In order to wake up the simulation kernel thread 230, the debug support thread 210 may signal the control mechanism 290, wherein the simulation kernel thread 230 resumes execution.

As used herein, the term thread may apply to an operating system process. However, as used throughout this description, the term thread is not limited to an operating system process. In some embodiments, the thread may be a part of an application program process.

Embodiments of the present invention allow a user to set halt-points in the simulations. Halt-points may include breakpoints, watchpoints, and the like. A breakpoint typically refers to a location in code, wherein the simulation halts and passes control of execution to the debugger when the code is hit. A watchpoint typically refers to a data access (e.g., a read or write of memory, hardware register, etc.), wherein a simulation halts and passes control of execution to the debugger when the data access occurs. Haltpoints are not limited to the examples herein and may be triggered by any event related to a simulation.

Furthermore, embodiments of the present invention allow a user to set multi-simulation halt-points. As used throughout this description, the term multi-simulation halt-point, multi-simulation breakpoint, multi-simulation watchpoint, multi-simulation breakpoint/watchpoint, or the like means that the halt-point or the like is based on events in two different simulations. For example, the events may be the combination of the program counter in the CPU1 simulation 275a reaching a user-defined value and an access to a register of a hardware simulation 280.

Figure 3:
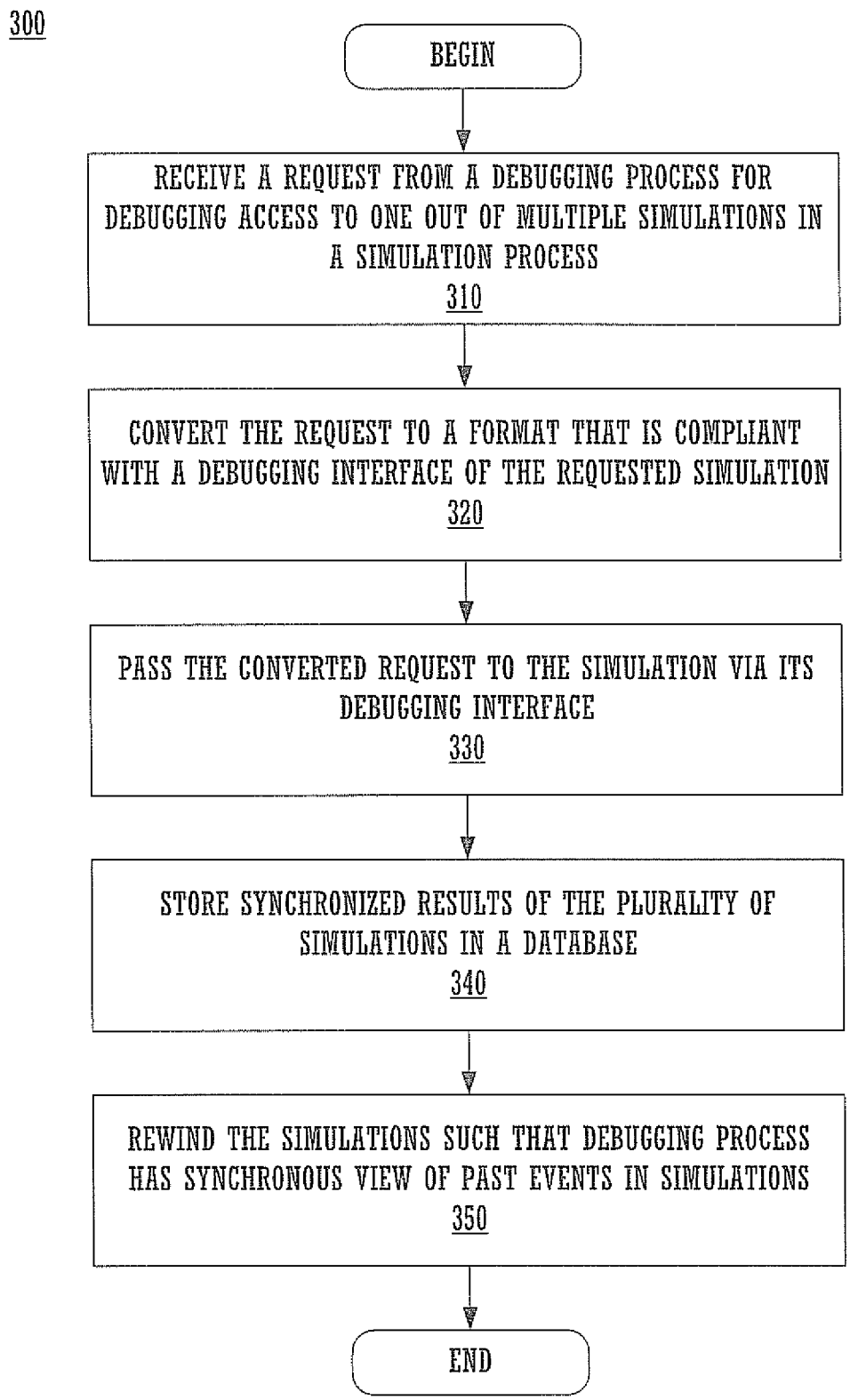
FIG. 3 is a flowchart illustrating a computer-implemented method of facilitating debugging via circuit simulations.

FIG. 3 is a flowchart illustrating a computer-implemented method of facilitating debugging via circuit simulations. Step 310 is receiving a request from a debugging process for debugging access to one of a plurality of simulations in a simulation process. Debugging access allows observation and control of the simulations. The request may be received by a debug support thread in the simulation process. Further, the plurality of simulations may be executing in a separate thread in the simulation process. The simulations have different debugging interfaces from each other for control and observation of the actual simulation. For example, referring to FIG. 2, each of the simulations 275a, 275b, and 280 have a different debugging interface, wherein the interface converter 220 uses three different interface converter blocks 240a-c to interface with the simulations.

Step 320 is converting the request to a format that is compliant with a debugging interface of the requested simulation. Step 320 may be performed by one of the interface converter blocks 240.

Step 330 is passing the converted request to the simulation via the debugging interface. Thus, the debugging process (e.g., platform debugger 270) has debugging access to the simulations. Throughout this application the term debugging access with respect to a simulation means access that allows control and observation of the simulation. In one embodiment, the request is for establishing multi-simulation breakpoints.

Step 340 is storing synchronized results of the simulations in a database. The database stores information that allows the results from each simulation to be compared at like points in time or execution. Embodiments of the present invention allow the simulations to be rewound, such that stored values may be viewed by the debugger. Moreover, the synchronization of the simulations is maintained. Moreover, the debugger can step through the results, wherein the results of all simulations are stepped together.

Step 350 is rewinding the simulations. For example, the results stored in the database are presented to the debugger, wherein the debugger views the results synchronized by time as measured by clock cycles.

Figure 4:
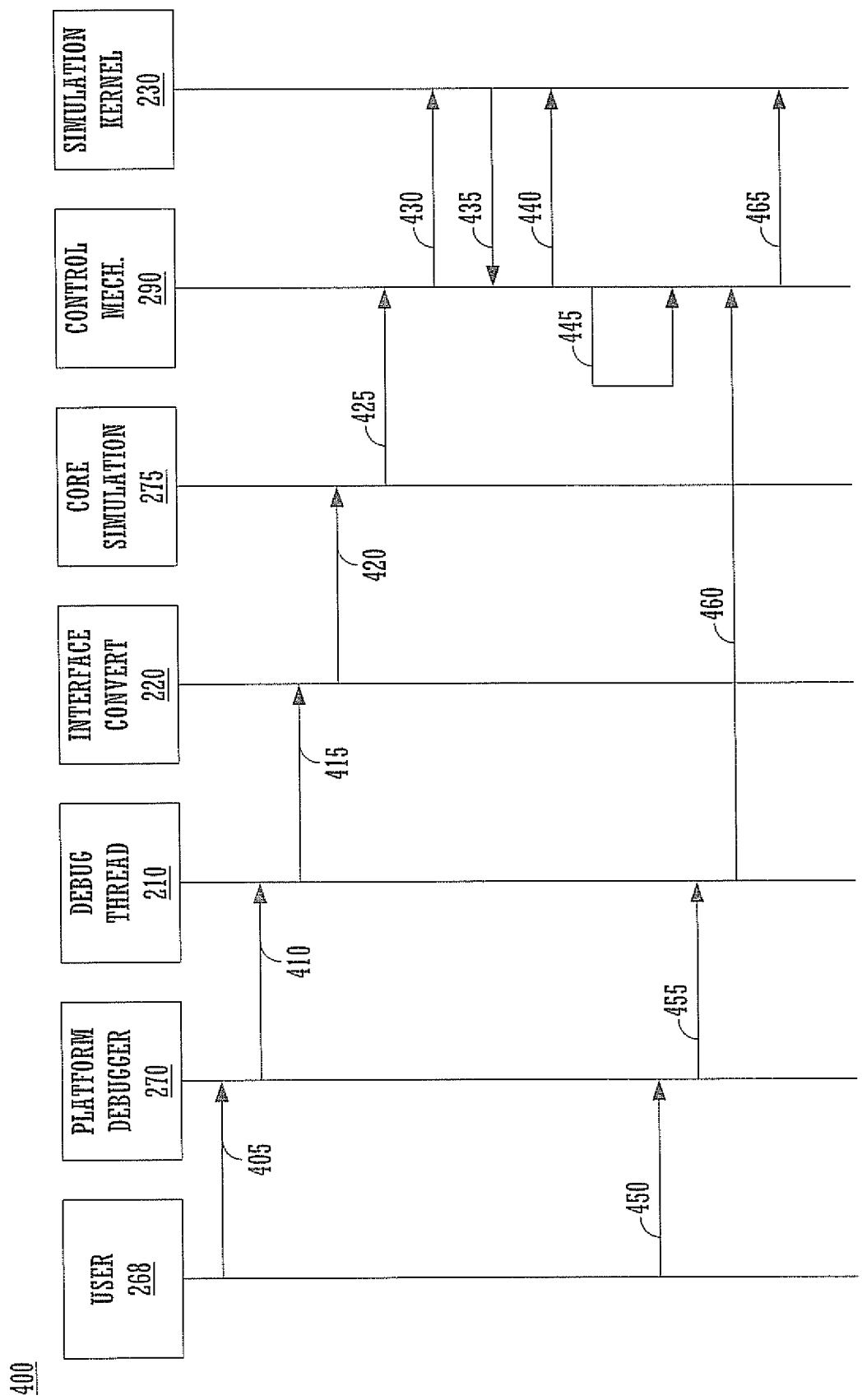
FIG. 4 illustrates a breakpointing sequence diagram, in accordance with an embodiment of the present invention.

FIG. 4 illustrates a breakpointing sequence diagram 400, in accordance with an embodiment of the present invention. In one embodiment, a semaphore is used as the control mechanism. However, the control mechanism is not limited to a semaphore. To set a breakpoint, a user 268 inputs the breakpoint information to the platform debugger (arrow 405). In response thereto, the platform debugger sends a message to the debug support thread identifying the processor core simulation and breakpoint information (arrow 410). The debug thread uses the interface converter to convert from the external API to the debug API for the processor core simulation (arrow 415). The breakpoint information is then passed on to the core simulation (arrow 420).

When the breakpoint is hit, the processor core simulation sends a message to the control mechanism indicating the time at which the breakpoint occurred (arrow 425). In order to facilitate synchronization of the various simulations, the processor core simulation executes in a run-ahead loop and allows other simulations to catch up after a breakpoint is hit, in one embodiment. As previously discussed, the simulations may be invoked by the simulation kernel thread to each execute up to a pre-determined number of clock cycles. If a simulation hits a breakpoint while executing its quantum of clock cycles, it notifies the simulation kernel thread of the time at which the breakpoint is hit such that the other simulations can execute up to that point in time rather than the entire quantum. Thus, when the processor core simulation hits the breakpoint, it breaks from its run-ahead loop and tells the control mechanism to break at time "T," where "T" is the point where the breakpoint occurs (arrow 425). The processor core simulation then waits until it is notified by the simulation kernel thread that the other simulations have caught up.

The simulation kernel thread will schedule other simulations (e.g., other processor core simulations, hardware simulation) for execution, which allows them to synchronize (e.g., catch up) with the core processor simulation that hit the breakpoint. The control mechanism may subscribe to a time advance callback of the simulation kernel thread (arrow 430) so that it is the first to be notified when time "T" is reached. When time "T" is reached, the simulation kernel thread notifies the control mechanism (arrow 435), which then unsubscribes from the time advance notification (arrow 440) and "waits on the control mechanism" to suspend the simulation kernel thread (arrow 445). Thus, all simulations in the simulation kernel thread are suspended and are also synchronized. The debugger platform still has complete visibility of all the simulations through the debug support thread.

To re-start the simulations, the user inputs a command into the platform debugger (arrow 450). In response to the command, the platform debugger sends a message to the debug support thread to initiate re-start of the simulation (arrow 455). In response thereto, the debug support thread signals the control mechanism to re-start the simulation kernel thread (arrow 460). The simulation kernel responds to the control mechanism by re-starting execution of all simulations (arrow 465).

A user may also wish to break at a certain simulation time (or have complex breakpoint conditions that involve time). This can be implemented very similar to a breakpoint depicted in FIG. 4. In one embodiment, an event is scheduled in the simulation at the time specified by the user. When this event is triggered by the simulation, it sends a message to the control mechanism passing the current time as a parameter (similar to arrow 425 in FIG. 4). Then steps similar to arrows 430, 435, and 440 of FIG. 4 may be taken in order to help synchronize the simulations. When the control mechanism receives a callback from the simulation kernel (similar to arrow 435 of FIG. 4) the simulation kernel thread will wait on the control mechanism (similar to arrow 445 of FIG. 4).

Figure 5:
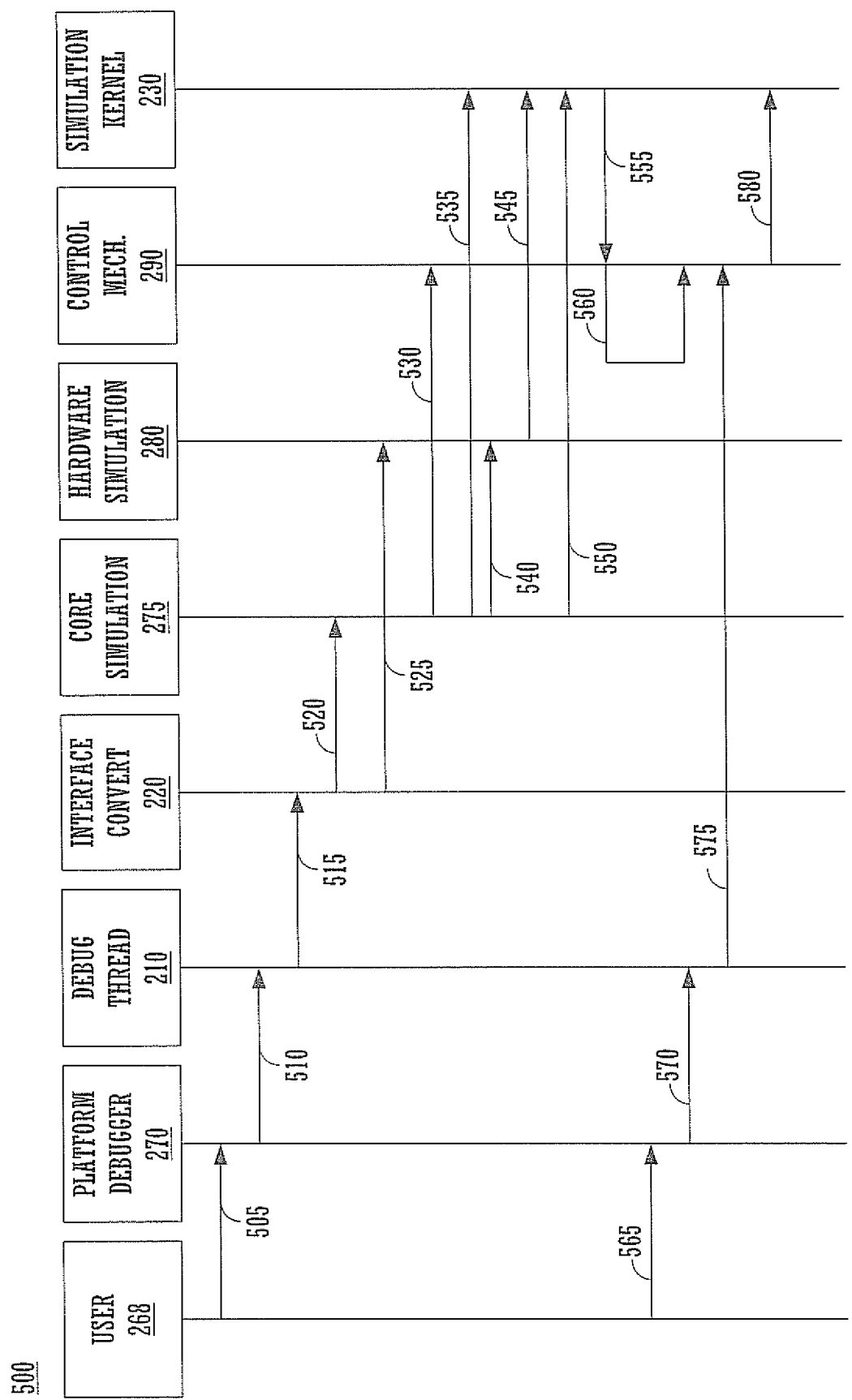
FIG. 5 depicts a sequence diagram for implemented a watchpoint, in accordance with an embodiment of the present invention.

Watchpoints may be used to suspend the simulation when a hardware register is read or written, in embodiments of the present invention. FIG. 5 depicts a sequence diagram for implementing a watchpoint 500, in accordance with an embodiment of the present invention. A user 268 inputs the desired watchpoint to the platform debugger (arrow 505). In response, the platform debugger sends a message to the debug support thread indicating the watchpoint (arrow 510). The debug support thread invokes the interface converter to send messages to a processor core simulation and to the hardware simulation indicating the watchpoint (arrows 515, 520, and 525). In this case, the watchpoint is an event (e.g., memory or register access) that the hardware simulation will detect. The processor core is made aware of the watchpoint for purposes of synchronizing the halting of the simulations, which will be discussed herein below.

In one embodiment, the processor core simulation runs "ahead of time." If the processor core simulation model determines that it is about to access a part of the hardware that has a watchpoint associated with it, the processor core simulation model will first synchronize with the other simulation models before doing the hardware access, effectively allowing them to "catch up." Thus, the processor core simulation model may notify the control mechanism (arrow 530) and the simulation kernel (arrow 535) as if a breakpoint were hit. The simulation kernel may then schedule other simulation models to allow them to catch up to the processor core simulation model.

However, instead of halting the simulation thereafter, the processor core simulation model continues and executes the instruction that accesses the hardware simulation (arrow 440). If the hardware simulation detects that the watchpoint is hit, it notifies the simulation kernel of this fact (arrow 445). As soon as the hardware access is over, control is returned to the processor core simulation model, which asks the simulation kernel to process any watchpoint that have been hit by the previously executed instruction (arrow 450). If the simulation kernel determines the watchpoint was hit, it "waits on the control mechanism" to suspend the simulation kernel thread (arrows 455 and 460).

To re-start the simulations, the user inputs a command into the platform debugger (arrow 465). In response to the command, the platform debugger sends a message to the debug support thread to initiate re-start of the simulation (arrow 470). In response thereto, the debug support thread signals the control mechanism (arrow 475). The simulation kernel responds to the control mechanism by re-starting execution of all simulations (arrow 480).

Exemplary Computer Platform

Figure 6:
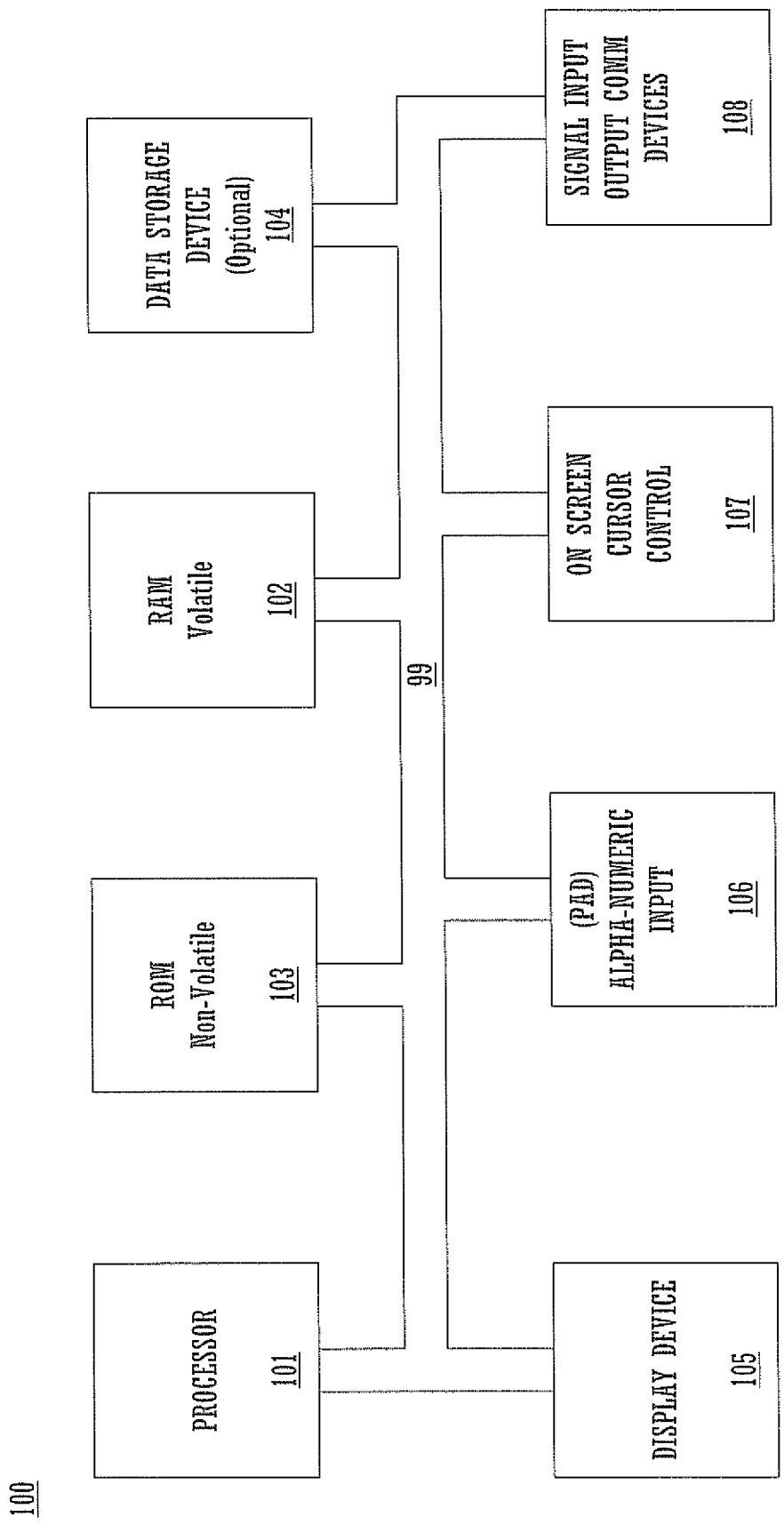
FIG. 6 is an exemplary computer system that may serve as a platform upon which embodiments of the present invention may be executed.
Figure 9:
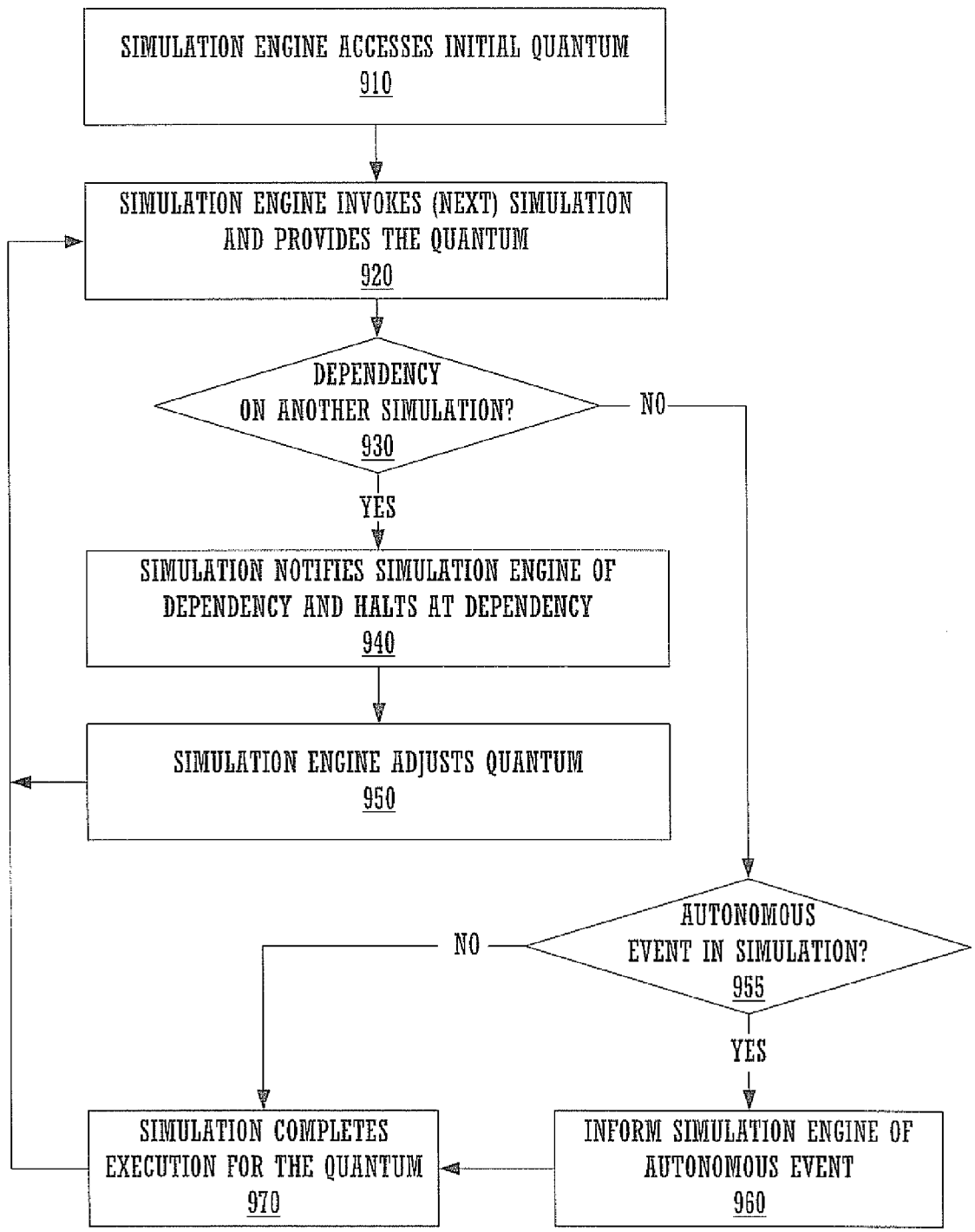
FIG. 9 is a flowchart illustrating steps of a process of performing a simulation of a computer system platform, in accordance with the present invention.
Figure 10:
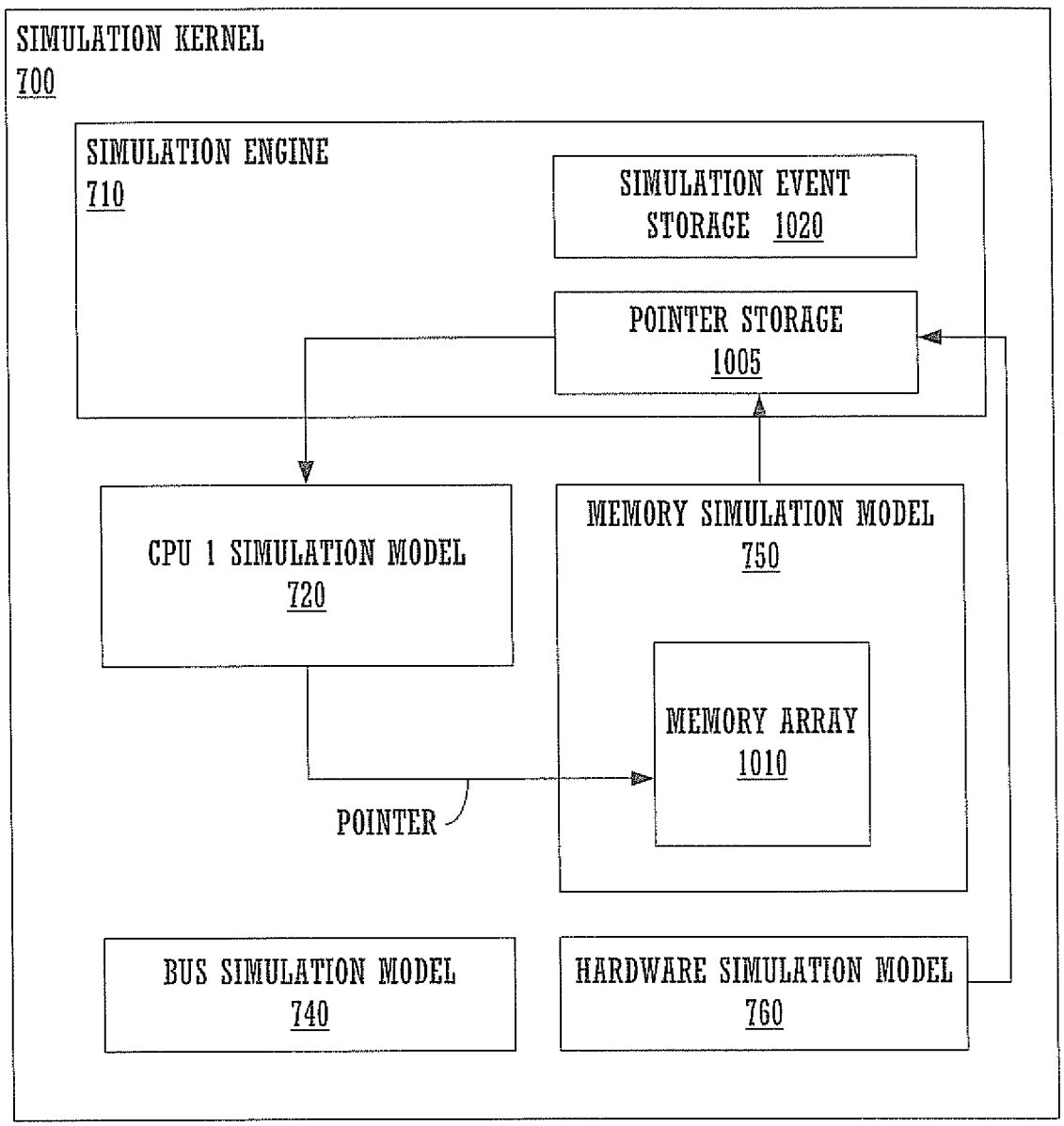
FIG. 10 is a block diagram of a simulation kernel illustrating backdoor memory accesses, in accordance with the present invention.

FIG. 6 illustrates circuitry of an exemplary computer system 100, which may form a platform for embodiments of the present invention. Computer system 100 may serve as a platform for the platform debugger (270, FIG. 2), the simulation process (210, FIG. 2), the simulation kernel (FIG. 7, 700; FIG. 10, 1000), or process 900 (FIG. 9). In some embodiments, the platform debugger and simulation process execute computer system 100. In other embodiments, they execute on separate computer systems.

Computer system 100 includes an address/data bus 99 for communicating information, a central processor 101 coupled with the bus for processing information and instructions, a volatile memory 102 (e.g., random access memory RAM) coupled with the bus 99 for storing information and instructions for the central processor 101 and a non-volatile memory 103 (e.g., read only memory ROM) coupled with the bus 99 for storing static information and instructions for the processor 101. The instructions may include steps of process 300 of FIG. 3 or process 900 of FIG. 9. Computer system 100 also includes an optional data storage device 104 (e.g., a magnetic or optical disk and disk drive) coupled with the bus 99 for storing information and instructions. The simulation results may be stored optional data storage device 104 or volatile memory 102.

With reference still to FIG. 6 system 100 may also include an alphanumeric input device 106 including alphanumeric and function keys coupled to bus 99 for communicating information and command selections to central processor unit 101. For example a user may input commands to the platform debugger via alphanumeric input device 106. System 100 may also include a cursor control device 107 coupled to bus 99 for communicating user input information and command selections to central processor unit 101. System 100 of the present embodiment may also include a display device 105 coupled to bus 99 for displaying information. For example, the platform debugger may be a graphical debugger capable of displaying data and graphics from the simulations. In one embodiment, the platform debugger executes on a device external to computer system 100. Computer system 100 has a signal input/output communication device 108 coupled to bus 99 providing communication with external devices for this and other purposes.

Dynamically Adjusting Speed Versus Accuracy of Computer Platform Simulation

Figure 7:
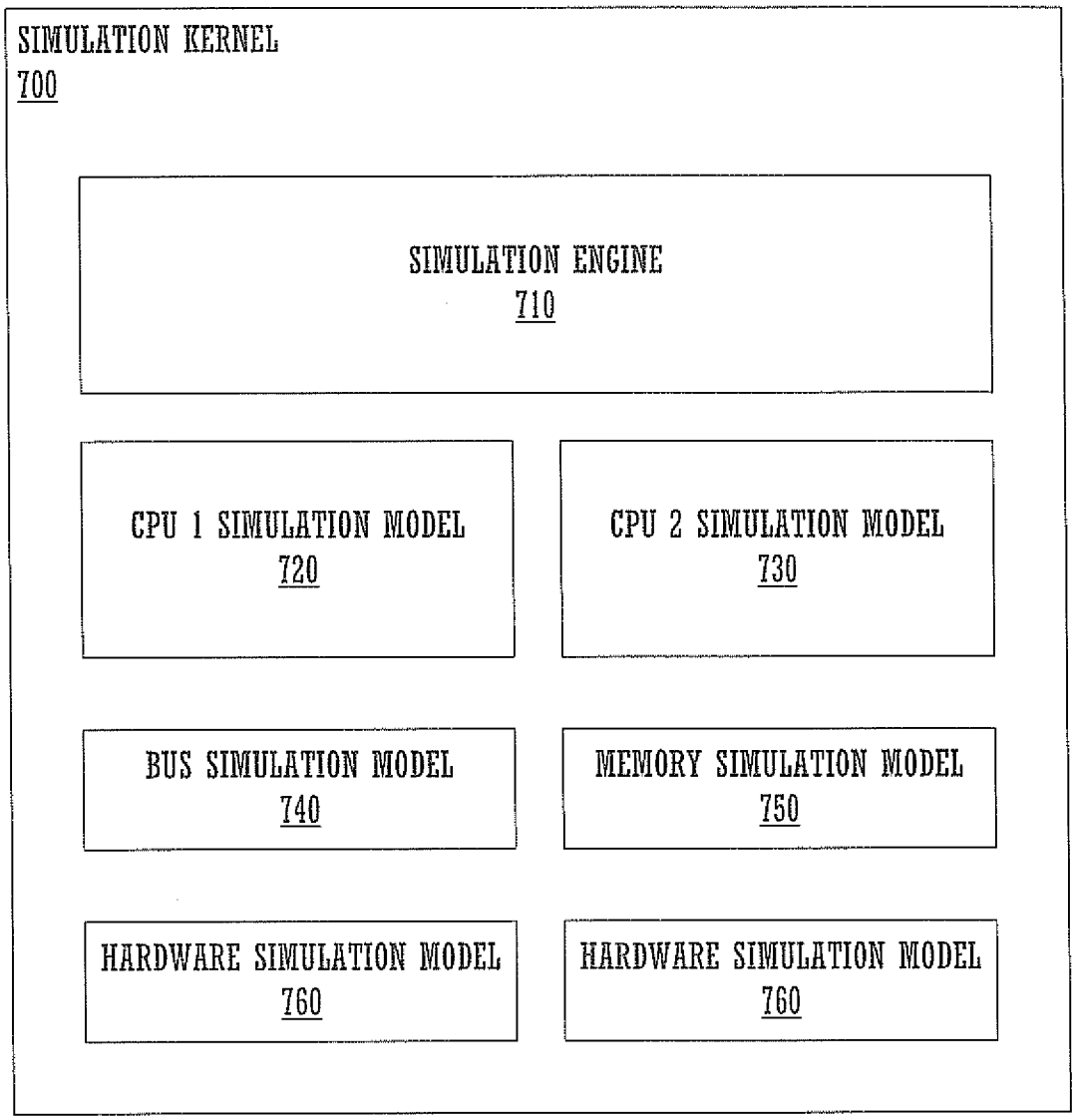
FIG. 7 is a block diagram illustrating a simulation kernel in accordance with an embodiment of the present invention.

FIG. 7 is a block diagram illustrating a simulation kernel in accordance with an embodiment of the present invention. The same overall simulation comprising simulation models 720, 730, 740, 750, 760 can be dynamically tuned for more accuracy or for more speed. The simulation results will be behaviorally correct even when the overall simulation is tuned for maximum speed. For example, the user selects a desired accuracy level and the simulation engine 710 can dynamically decide to temporarily increase accuracy to ensure behavioral correctness. The simulation engine 710 should not simulate with less accuracy than requested by the user.

The simulation models 720, 730, 740, 750, 760 are capable of cycle accurate simulation, in one embodiment. However, the simulation models may be executed in a mode that is less than cycle accurate, while still achieving behaviorally correct simulation results. Embodiments of the present invention increase simulation speed without sacrificing accurate results by reducing the impact of simulation bottlenecks. An example of a bottleneck in the simulation is the communication between one of the CPU simulations 720, 730 and the memory simulation 750. Another example of a bottleneck is between one of the CPU simulations 720, 730 and one the hardware simulations 760, which may be modeling a peripheral component. Moreover, a bus simulation 740 may be invoked in a cycle-accurate simulation, which provides greater simulation accuracy but may reduce the simulation efficiency.

For a cycle accurate simulation, clock signals may be used to synchronize the different simulations (as may be done in the architecture being simulated). A large portion of the work of the simulation engine 710 is to manage and schedule clock signals. Embodiments of the present invention reduce the simulation engine's clock management workload by reducing the number of times that the simulations (e.g., 720, 730, 740, 750, 760) are synchronized. Instead of synchronizing the simulations each clock cycle, embodiments of the present invention synchronize every "quantum" of execution units. The "quantum" is a number of clock cycles in one embodiment. However, the quantum may be any convenient unit of execution.

Using a quantum allows a simulation to execute many clock cycles without having to stop to synchronize. For example, a CPU simulation model may execute dozens, hundreds, thousands or more instructions in a row, without having to stop to synchronize with the other simulation models. The CPU simulation may not be dependent upon an event in another simulation for a substantial time period. Thus, the CPU simulation result may be behaviorally accurate without synchronizing even though the CPU simulation is not cycle-accurate.

Figure 8A:
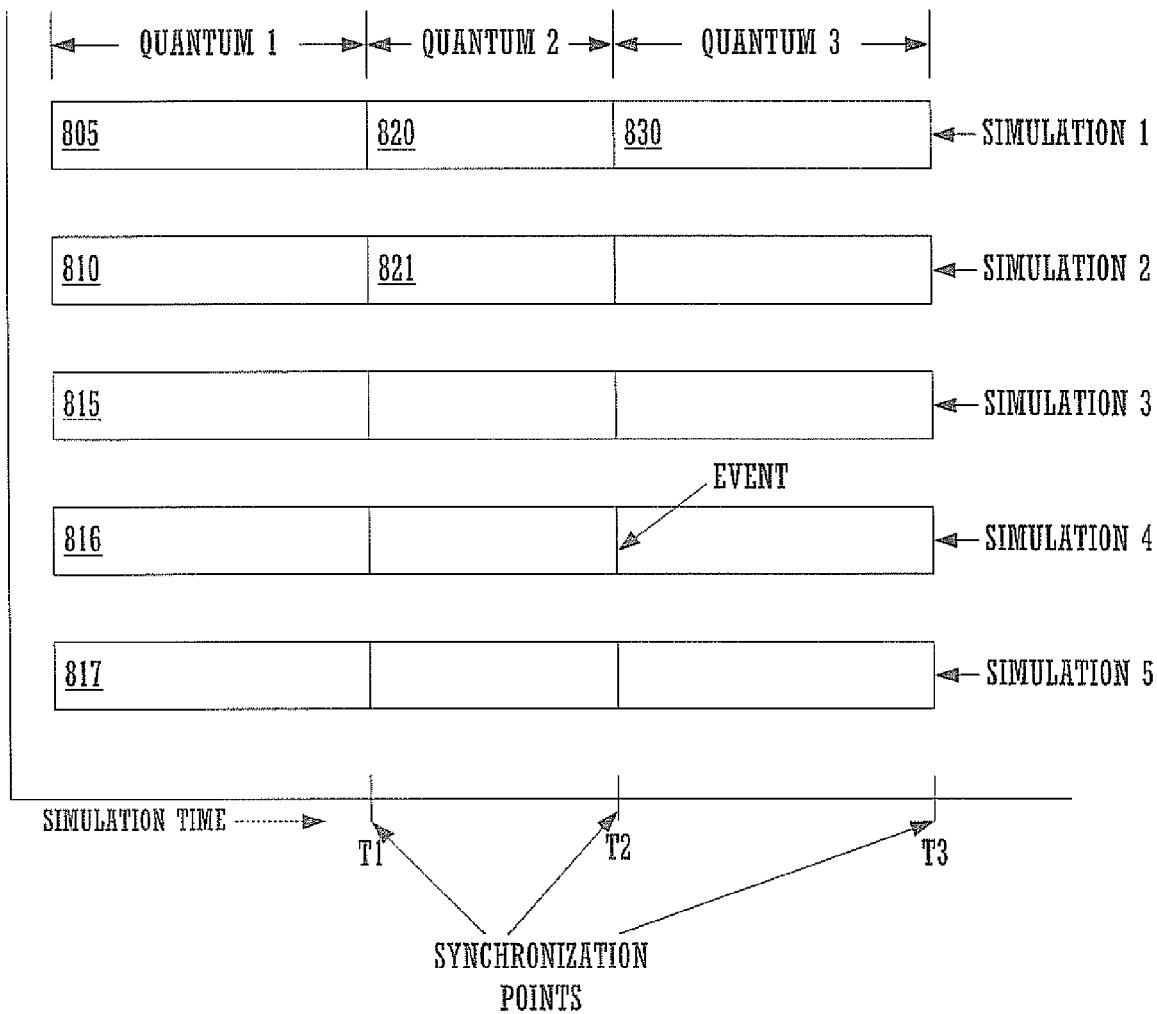
FIG. 8A is a diagram illustrating dynamically modifying a quantum of execution units performed by simulation while maintaining behaviorally correct results, in accordance with an embodiment of the present invention.

Referring to FIG. 8A, the simulations may be invoked by the simulation engine, wherein each simulation is allowed to execute up to the quantum of execution units (e.g., clock cycles) without stopping, for example, to synchronize with another simulation. Thus, simulation 1 may execute its quantum (block 805), followed by simulation 2 (block 810), then the rest of the simulations may be invoked (blocks 815, 816, 817. At that point, the simulations are synchronized (Simulation Time Ti). It is not required that the simulations be executed one at a time. For example, the simulation models could execute in parallel on different processors of a multiprocessor system. However, the simulation models are allowed to execute a quantum of instructions without the need to stop and synchronize with another simulation.

It is not required that each of the simulations are actually invoked every time it has a chance to run. For example, it is possible that a hardware simulation may not have any work to do for its quantum, in which case it might not be invoked or invoked and shut down quickly. In some embodiments of the present invention, the simulation models have an internal clock that is shut off when the simulation is asleep to save the overhead of the clock running. Thus, the simulations can be written to be responsive, as opposed to having autonomous behavior. As an example, peripheral hardware may be modeled to be responsive or mostly responsive rather than autonomous. Furthermore, the bus simulation model may also be written to be responsive. This allows a processor simulation to execute very large numbers of instructions, while still providing a behaviorally accurate simulation.

To ensure behavioral correctness of the simulation, the quantum may be dynamically adjusted so that a simulation does not run past an autonomous event scheduled in another simulation. Referring again to FIG. 4, an autonomous event may be scheduled to occur in simulation 4 at a known time. Simulation 4 informs the simulation engine of this autonomous event and its simulation time at some convenient time prior to the autonomous event. The simulation engine stores this and other simulation events (FIG. 10, 1020). The simulation engine dynamically adjusts the quantum such that other simulations do not run past this autonomous event.

In a typical scenario, the autonomous event may be an event scheduled to take place in a hardware simulation. An embodiment of the present invention typically schedules a processor simulation prior to memory and hardware simulations. Thus, in order to keep the processor simulation from running past the scheduled event in, for example, a hardware simulation, the quantum is reduced in size prior to the processor simulation being invoked. If the frequency of events in memory, bus, or hardware simulations is too high, the quantum can be negatively impacted. However, as described below, embodiments of the present invention provide for techniques to reduce the impact of such events, wherein the quantum is not impacted by certain classes of events. These events are not necessarily autonomous events.

Thus, referring again to FIG. 8A, each simulation executes for quantum 1. Simulation 4 has an event scheduled at simulation time T2. Therefore, quantum 2 is reduced to end at simulation time T2. The reduction is done prior to simulation 1 being invoked to execute its block 820, such that all simulations execute for the reduced quantum and do not run past the autonomous event. After simulation 1 returns control to the simulation engine, simulation 2 is then invoked to execute (block 821). Simulations 3-5 may then be invoked.

The size of the quantum may be based on a value input by the user. Typically, the quantum should be given the highest possible value that still gives a behaviorally correct simulation result. Thus, since there are no autonomous events scheduled between synchronization times T2 and T3, the quantum is increased back to it maximum possible value (quantum 3). The simulation engine should not increase the quantum to a value larger than the user-specified value.

Figure 8B:
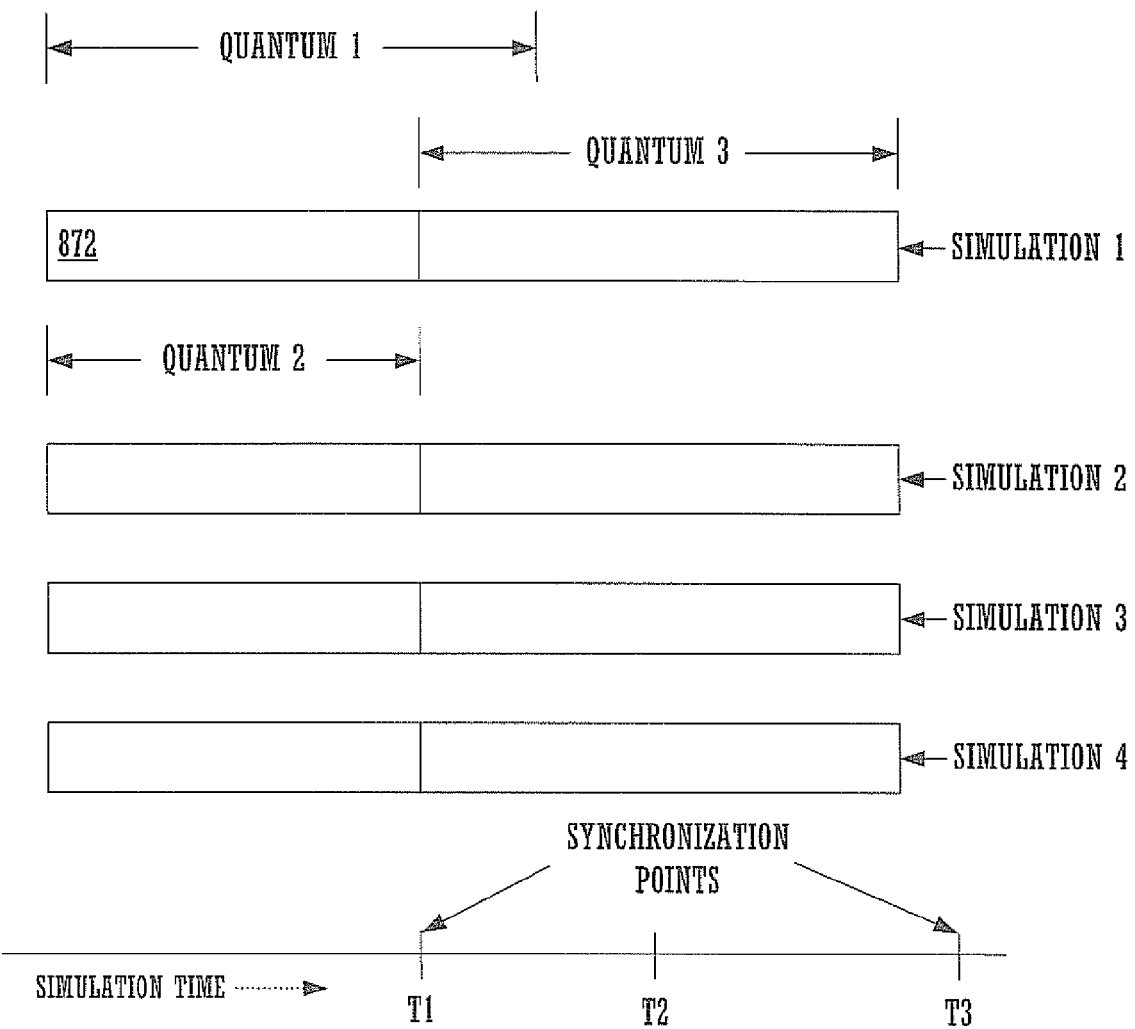
FIG. 8B is a diagram illustrating dynamically modifying a quantum when a simulation detects a dependency on another simulation or a halting point in its simulation, in accordance with an embodiment of the present invention.

In some cases, a simulation is able to determine that it should halt prior to completion of its maximum quantum of execution units based on either an event in its simulation or one that it may trigger in another simulation model. Referring to FIG. 8B, initially the quantum is "quantum 1" (ending at simulation time T2) and no known dependencies exist that would indicate the quantum should be shortened. However, simulation 1 stops its execution partway through its quantum of execution units (block 872). This may occur because simulation 1 determined that it has a dependency on another simulation at simulation time T1 such that it cannot continue behaviorally accurate simulation. Alternatively, simulation 1 may have hit a breakpoint or watchpoint. Or simulation 1 may determine that it may cause an event in another simulation. For example, simulation 1 may determine that by writing to a register in another simulation it may cause a watchpoint in that other simulation to be hit. Simulation 1 will inform the simulation engine of the stopping point (Ti) when returning control to the simulation engine.

The simulation engine then dynamically adjusts the quantum to "quantum 2" so that the rest of the simulations stay synchronized with simulation 1. The simulation engine then invokes simulations 2-4 to execute up to the quantum, which has been dynamically modified to "quantum 2." Then, the simulation engine may invoke simulations 1-4 to execute to simulation time T3 by dynamically modifying the quantum to "quantum 3."

Figure 8C:
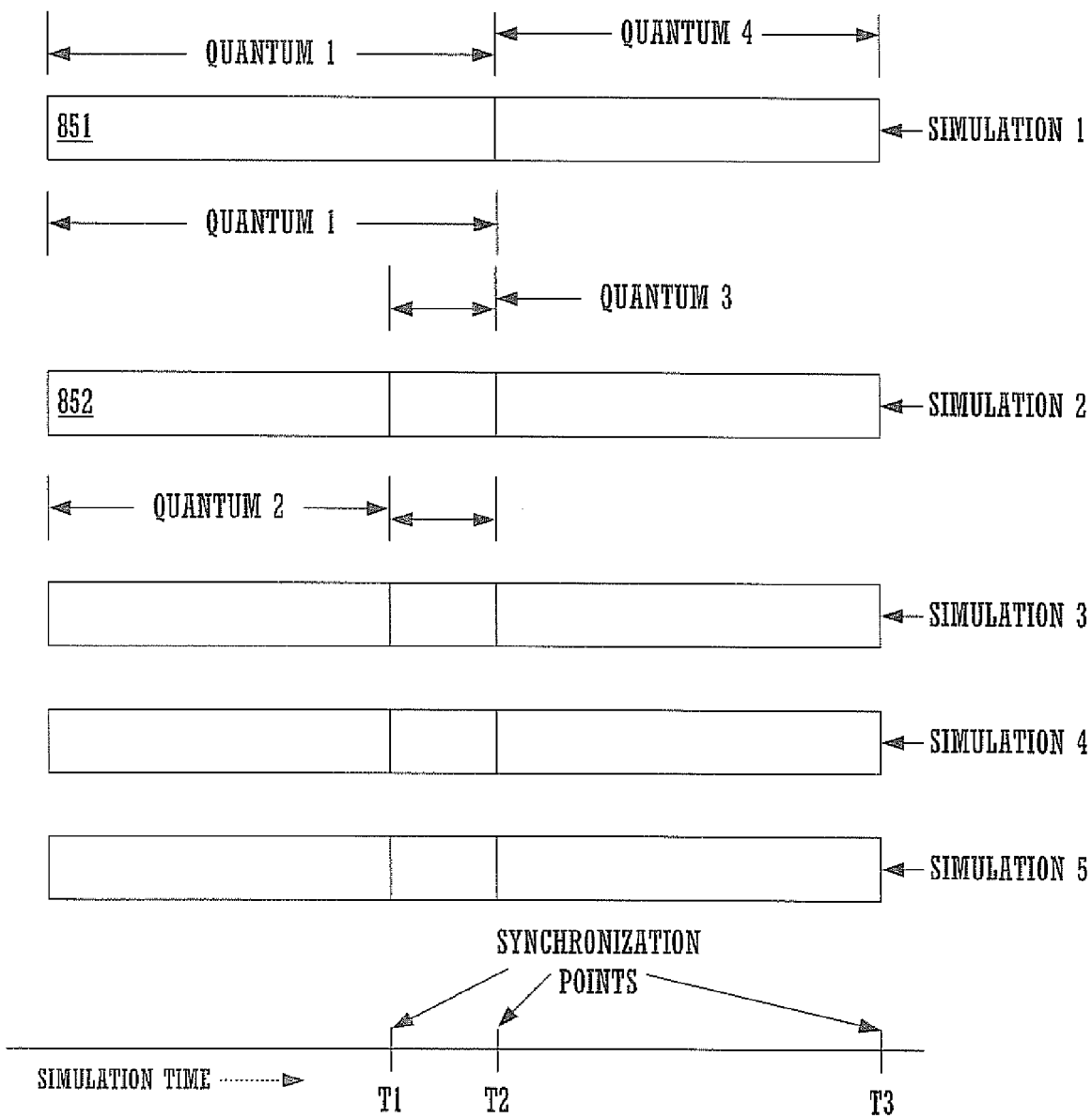
FIG. 8C is a diagram illustrating dynamically modifying a quantum when a simulation runs ahead of other simulations, in accordance with an embodiment of the present invention.

In some cases, it is unknown that an event will occur in a simulation that would cause another simulation to get ahead in execution. Referring to FIG. 8C, initially the quantum is "quantum 1" and simulation 1 executes its quantum of execution units entirely (block 851). When simulation 2 is invoked the quantum is still "quantum 1" because no known dependencies exist that would indicate the quantum should be shortened. However, simulation 2 stops its execution partway through its quantum of execution units (block 852). This may occur because simulation 2 determined that it has a dependency on another simulation at simulation time T4 such that it cannot continue behaviorally accurate simulation. Alternatively, simulation 2 may have hit a breakpoint or watchpoint. Simulation 2 will inform the simulation engine of the stopping point (T4) when returning control to the simulation engine.

The simulation engine then dynamically adjusts the quantum to "quantum 2" so that the rest of the simulations stay synchronized with simulation 2. The simulation engine then invokes simulations 3-5 to execute up to the quantum, which has been dynamically modified to "quantum 2." Simulations 2-5 will be synchronized at simulation time T4. It is not required that simulation 1 be synchronized with the rest of the simulations at this point, If a user views simulation results at this point, the user will be informed that simulation 1 has "run ahead of time" and is stopped at simulation time 15. When the simulations are restarted, the simulation engine may invoke simulations 2-5 to execute to simulation time T5 by dynamically modifying the quantum to "quantum 3." Then, the quantum may be re-set to a higher value for more efficient simulations (quantum 4), wherein simulations 1-5 are invoked and allowed to execute up to simulation time T6 without any of the simulation models stopping to synchronize with another simulation model.

FIG. 9 is a flowchart illustrating steps of a computer-implemented process 900 of performing a simulation of a computer system platform, in accordance with the present invention. In Step 910, a simulation engine accesses an initial value for a quantum. The initial value is typically received from a user and is typically a maximum value that the quantum can ever be in the simulation. The quantum is dynamically adjustable, wherein the current value of the quantum specifies a maximum number of units of execution a simulation is allowed to perform. The user may change the quantum during the execution of the simulation, without having to recompile the simulation. Therefore, the user may adjust the dynamic quantum to select between a between a cycle accurate simulation mode and a behaviorally accurate simulation mode.

Step 920 comprises the simulation engine invoking a first simulation for execution and informing the simulation of the current value of the quantum. Thus, the simulation is aware of the maximum number of units of execution it is allowed to perform.

The simulation is not required to complete all of the execution units. For example, if the simulation identifies a dependency on another simulation in step 930, it halts in step 940. Moreover, in step 940 the simulation notifies the simulation engine of the time at which it halted. Thus, in step 950, the simulation engine modifies the dynamic quantum. Then, the process 900 returns to step 920 wherein the simulation engine invokes the next simulation, providing it with the current value of the dynamic quantum.

However, in the typical case, a simulation will complete the entire quantum of execution units. If the simulation is aware of an autonomous event in its simulation (step 955), it may inform the simulation of this in step 960. For example, a hardware simulation may inform the simulation engine that it has an upcoming autonomous event so that it will be awoken to simulate the autonomous event. Moreover, the simulation engine may modify the quantum to prevent other simulations from running ahead of this autonomous event. The simulation engine keeps track of this and other autonomous events, such that it may modify the dynamic quantum at the appropriate time.

In step 970, the simulation completes and returns control to the simulation engine. The process 900 then returns to step 920, wherein the simulation engine invokes the next simulation model.

As discussed above, autonomous events can impact the quantum. However, most hardware simulations may be modeled to be entirely responsive, or at least mostly responsive, e.g., they have none or little autonomous behavior. The real-world hardware typically has a high frequency clock signal that may be used to guide a state machine. As a consequence, conventional hardware simulation models typically include a high frequency clock signal and a state machine. However, because the hardware is typically accessed infrequently, this modeling style may cause substantial overhead because on the vast majority of clock cycles the hardware does no work. This modeling style can be achieved by the present invention if the dynamic quantum were set to one clock cycle, since the simulation engine would interact with the hardware simulations every clock cycle.

However, embodiments of the present invention provide a much more efficient hardware simulation model. These simulation modes may be described as functional models, which simulate the function of the hardware instead of the actual hardware implementation. Thus, the hardware simulation model normally "sleeps" and is "woken up" by incoming communication. The hardware simulation model then executes the needed behavior and goes to "sleep" again. If a hardware simulation model needs to execute behavior in the future, it asks the simulation engine to wake it up again at that time in the future and goes to "sleep" again. The vast majority of hardware (e.g., peripherals) can be modeled in this fashion. Moreover, busses and memory can be modeled in this functional fashion, as well.

Because these functional simulations do not use clock signals, this removes one of the bottlenecks. Moreover, the quantum will only be limited dynamically whenever a processor simulation model actually accesses the hardware simulation, which normally happens with a relatively low frequency, meaning the dynamic quantum can often be equal to a maximum value specified by a user.

Another embodiment of the present invention provides for bypassing invocation of a simulation model to bypass a non-autonomous simulation event when behavior of the non-autonomous simulation event is not desired. In one embodiment, "backdoor memory accesses," are used in order to improve simulation efficiency. The backdoor memory access can bypass a simulation event that might impact the quantum. The bypassed events may be non-autonomous events. For example, for every instruction that a real-world processor executes, there is at least one memory access, e.g., the opcode fetch. Thus, it is possible to simulate this by invoking the processor simulator and the memory simulator (along with the bus simulator). Invoking the simulators in this fashion could cause the dynamic quantum to be very low, typically two or three clock cycles.

However, the memory and bus simulation models do not need to be invoked for correct and accurate behavior of a processor simulation memory access. Thus, rather than invoking the memory (and bus) simulation models, an embodiment of the present invention directly reads the memory in the memory simulation model. Referring to FIG. 10, a memory simulation model 750 may allocate a large array 1010 of bytes to model the memory. When a communication request comes into the memory simulation model 750, the memory simulation indexes into the array and returns the proper value.

However, rather than invoking the memory simulation 750, as just described, an embodiment of the present invention performs a "backdoor access," in which the memory simulation 750 is not invoked. With a backdoor access, instead of going over the bus, the processor simulation 720 uses a pointer to index the memory array 1010. The simulation engine has pointer storage 1005 and receives pointers from the memory model 750, and possibly other simulation models. Neither the bus simulation 740 nor the memory simulation model 750 need be invoked. Therefore, the quantum is not impacted by this event. The user may be allowed to specify whether such backdoor accesses are permitted or not.

Backdoor memory accesses may reduce the accuracy of the simulation. One reason for reduced accuracy is that a backdoor access may take zero simulation time. Typically, a real CPU to memory access over the bus would require several clock cycles. Thus, an embodiment of the present invention allows a user to estimate the number of clock cycles that a backdoor access would take and input this as a simulation parameter. More than one estimate can be provided, based on the type and/or sequence of accesses (e.g., read, write, write followed by read, etc.) The processor simulation 720 factors in the estimated access time when it determines the number of instructions it can execute within its quantum. Thus, the potential loss of simulation accuracy is reduced or eliminated by factoring in the estimate.

Backdoor accesses may apply to other than instruction fetches. In one embodiment, the processor simulation model understands when it is safe to perform a backdoor access. That is, the processor simulation model understands when a behavior that should be simulated is associated with the memory access. If there is such a behavior, then the processor simulator does not perform a backdoor memory access.

Furthermore, a backdoor access can apply to other than a memory simulation. This allows a more efficient simulation for pieces of hardware that may be frequently accessed. Thus, the hardware simulation may also provide one or more pointers to the simulation engine.

In one embodiment, the backdoor access does not use the bus simulation model or the memory (or hardware) simulation model. In this case, the backdoor access does not trigger the behavior associated with the memory (or hardware) access. In another embodiment, the backdoor access does not use the bus simulation model but does invoke the memory (or hardware) simulation model. In this case, the backdoor access does trigger the behavior associated with the memory (or hardware) access.

The user is allowed to select backdoor accesses "on the fly." For example, a graphical user interface, such as a debugging tool, allows the user to specify which simulations may perform backdoor accesses. Furthermore, the user may be allowed to specify under what conditions backdoor accesses are allowed. For example, a user may specify that backdoor accesses are allowed for only instruction fetches. Further, embodiments of the present invention allow selection of backdoor access on a per component basis within a given simulation model. For example, the backdoor access may be specified on a register-by-register basis. The user can modify any of the backdoor access parameters without the need to re-compile the simulation.

There may be cases, in which dynamic adjustment of the quantum is insufficient to get correct behavioral simulation results. For example, consider a dual processor system in which CPU2 monitors a piece of memory that is shared by both CPU1 and CPU2. The software running on CPU1 will write data to the shared memory that CPU2 processes. A conventional way of communicating between the CPUs is by means of interrupt signals. By sending back and forth interrupts, CPU2 knows that CPU1 has written to the shared memory and CPU1 knows that CPU2 has read the shared memory. If the simulation has knowledge of the interrupt, then the simulation can stop execution prior to completing its quantum, such that it will not run past the interrupt event.

However, the software developer may avoid using an interrupt by exploiting the fact that it is known which software is running on both CPU's. For example, if it is known that CPU1 will put a new element in the shared memory every 20 clock cycles, then that knowledge can be exploited in CPU2. If CPU1 is aware that CPU2 exploits that knowledge, then CPU1 can know when it is safe to overwrite the shared memory based on the shared timing knowledge, rather than using an interrupt.

However, the simulation models may be unaware of this timing knowledge. For example, if an interrupt is used, the simulation may have explicit information regarding the interrupt. However, if the aforementioned timing knowledge is used instead of interrupts, the simulation may not contain explicit information about the timing of the shared memory accesses. An embodiment of the present invention prevents possible incorrect simulation results that may occur due to such dependencies that are not explicitly indicated in the simulations.

The following example will serve to illustrate a possible incorrect result, which is avoided by an embodiment of the present invention. The software developer may program CPU1 to write to shared memory every 20 clock cycles and CPU2 to read the shared memory every 20 clock cycles. However, this timing information may not be explicitly obtainable from the simulations. If the quantum were set to 100 clock cycles, CPU1 could overwrite the shared memory before CPU2 would read the shared memory (or vice versa). Thus, the simulation results will likely be incorrect. An embodiment of the present invention allows the user to set a maximum value of the quantum. The simulation engine may only dynamically reduce the quantum, in this embodiment. In this case, the quantum might be limited by the user to 20 clock cycles (e.g., the resolution of timing based communication between both CPUs).

In many systems the processor is the only real autonomous block and memory and hardware accesses are infrequent. More complex systems have one or more autonomous blocks besides the CPU or may have multiple CPUs. In one embodiment of the present invention, each autonomous simulation model may have its own quantum. For example, the dynamic quantum may be adapted to a specific simulation, or it may be individually adapted to a plurality of autonomous simulations. Simulation models that are wholly or largely responsive (e.g., non-autonomous) may have their quantum set to the lowest quantum in current use.

The preferred embodiment of the present invention are thus described. While the present invention has been described in particular embodiments, it should be appreciated that the present invention should not be construed as limited by such embodiments, but rather construed according to the below claims.

What is claimed is:

1. A computer-implemented method for debugging a plurality of simulations, said method comprising:
    accessing a debugging access request via an interface to a debugger;
    converting said debugging access request to a first converted debugging access request and a second converted debugging access request, the first converted debugging access request operable to modify execution of a first simulation of the plurality of simulations and the second converted debugging access request operable to modify execution of a second simulation of the plurality of simulations; and
    sending said first converted debugging access request to the first simulation via an interface to the first simulation and sending said second converted debugging access request to the second simulation via an interface to the second simulation.

2. The computer-implemented method of claim 1 wherein the interface to the first simulation comprises a debugging Application Programming Interface (API).

3. The computer-implemented method of claim 1 wherein the interface to the first simulation comprises a first debugging Application Programming Interface (API) and the interface to the second simulation comprises a second debugging API different from the first API.

4. The computer-implemented method of claim 1 wherein the first simulation comprises a hardware simulation.

5. The computer-implemented method of claim 1 wherein the first simulation comprises a processor simulation.

6. The computer-implemented method of claim 1 further comprising:
    signaling said plurality of simulations to halt at a common point in execution.

7. The computer-implemented method of claim 6 further comprising:
    signaling said plurality of simulations to re-start after a halt point.

8. A system for debugging of a plurality of simulations executing on at least one processor, the system comprising:
    an interface to a debugger for accessing a debugging access request;
    an interface converter for converting said debugging access request to a first converted debugging access request and a second converted debugging access request, the interface converter communicatively coupled with said first interface, the first converted debug access request operable to modify execution of a first simulation of the plurality of simulations and the second converted debug access request operable to modify execution of a second simulation of the plurality of simulations;
    an interface to the first simulation for sending said first converted debugging access request to the first simulation; and
    an interface to the second simulation for sending said second converted debugging access request to the second simulation.

9. The system of claim 8 wherein the interface to the first simulation comprises a debugging Application Programming Interface (API).

10. The system of claim 8 wherein the interface to the first simulation comprises a first debugging Application Programming Interface (API) and the interface to the second simulation comprises a second debugging API different from the first API.

11. The system of claim 8 wherein the first simulation comprises a hardware simulation.

12. The system of claim 8 wherein the first simulation comprises a processor simulation.

13. The system of claim 8 wherein said interface converter is operable to signal said plurality of simulations to halt at a common point in execution.

14. The system of claim 13 wherein said interface converter is further operable to signal a simulation thread to re-start after a halt point, wherein said simulation thread comprises said plurality of simulations.

15. An article of manufacture including a computer-readable storage medium having instructions stored thereon that, if executed by a computing device, cause the computing device to:
   access a debugging access request via an interface to a debugger;
   convert said debugging access request to a first converted debugging access request and a second converted debugging access request, the first converted debugging access request operable to modify execution of a first simulation of the plurality of simulations and the second converted debugging access request operable to modify execution of a second simulation of the plurality of simulations; and
   send said first converted debugging access request to the first simulation via an interface to the first simulation and sending said second converted debugging access request to the second simulation via an interface to the second simulation.

16. The article of manufacture of claim 15 wherein the interface to the first simulation comprises a debugging Application Programming Interface (API).

17. The article of manufacture of claim 15 wherein the interface to the first simulation comprises a first debugging Application Programming Interface (API) and the interface to the second simulation comprises a second debugging API different from the first API.

18. The article of manufacture of claim 15 wherein the first simulation comprises a hardware simulation.

19. The article of manufacture of claim 15 wherein the first simulation comprises a processor simulation.

20. The article of manufacture of claim 15 wherein said instructions further cause the computing device to:
   signal said plurality of simulations to halt at a common point in execution.

21. The computer-implemented method of claim 1 wherein the interface to the debugger is operable for sending a unified view of said plurality of simulations, said unified view of said plurality of simulations operable for controlling synchronized execution of said plurality of simulations that allows each of said plurality of simulations to execute for a predetermined number of clock cycles.

* * * * *